(12) United States Patent
Ito et al.

(10) Patent No.: US 8,670,574 B2
(45) Date of Patent: Mar. 11, 2014

(54) SOUND VOLUME ADJUSTING APPARATUS

(75) Inventors: Taini Ito, Hamamatsu (JP); Koichi Fuse, Hamamatsu (JP)

(73) Assignee: Yamaha Corporation, Hamamatsu-shi (JP)

(*) Notice: Subject to any disclaimer, the term of this patent is extended or adjusted under 35 U.S.C. 154(b) by 565 days.

(21) Appl. No.: 12/868,432

(22) Filed: Aug. 25, 2010

(65) Prior Publication Data

US 2011/0051959 A1    Mar. 3, 2011

(30) Foreign Application Priority Data

Aug. 26, 2009  (JP) .................. 2009-195052

(51) Int. Cl.
*H03G 3/00*  (2006.01)
(52) U.S. Cl.
USPC ..................................... 381/109; 381/105
(58) Field of Classification Search
USPC ............................................. 381/104–109
See application file for complete search history.

(56) References Cited

U.S. PATENT DOCUMENTS

| | | | |
|---|---|---|---|
| 4,558,624 | A | 12/1985 | Tomisawa et al. |
| 5,513,268 | A | 4/1996 | Bironas et al. |
| 5,745,057 | A | 4/1998 | Sasaki et al. |
| 6,535,611 | B1 | 3/2003 | Lau |
| 2006/0072769 | A1* | 4/2006 | Taniguchi ............ 381/104 |
| 2011/0255712 | A1* | 10/2011 | Urata ................... 381/107 |

FOREIGN PATENT DOCUMENTS

| | | |
|---|---|---|
| EP | 1 703 265 A2 | 9/2006 |
| JP | 58-65496 A | 4/1983 |
| JP | 9-93688 A | 4/1997 |
| JP | 11-68484 A | 3/1999 |
| JP | 2002-84589 A | 3/2002 |
| JP | 2002-335137 A | 11/2002 |
| JP | 2004-56479 A | 2/2004 |
| JP | 2004-222077 A | 8/2004 |
| WO | WO 2010/044439 A1 * | 4/2010 |

OTHER PUBLICATIONS

European Search Report dated Nov. 9, 2010 (six (6) pages).
Japanese Office Action dated Mar. 15, 2013 including English-language translation (Eight (8) pages).

* cited by examiner

*Primary Examiner* — Disler Paul
(74) *Attorney, Agent, or Firm* — Crowell & Moring LLP

(57) ABSTRACT

A sound volume adjuster includes: a storage which stores a first value of a volume setting value and an allowable maximum change amount; a receiver which receives a change request indicating a second value of the volume setting value; a determiner which, when a change amount of the volume setting value between the first value and the second value exceeds the allowable maximum change amount, determines that the change request is an excessive request; and an adjuster which, when the determiner determines that the change request is the excessive request: changes the first value stored in the storage by a change amount which is equal to or smaller than the allowable maximum change amount to set a third value of the volume setting value; and adjusts a sound volume by the third value.

5 Claims, 4 Drawing Sheets

SOUND VOLUME ADJUSTING APPARATUS

BACKGROUND OF THE INVENTION

The present invention relates to a sound volume adjusting apparatus which adjusts sound volume in accordance with a received volume setting value.

A slider or a rotary knob is used as an interface for adjusting the sound volume. A slider and a rotary knob can adjust the sound volume in a wide range for a short time period. However, there is a case where the sound volume is erroneously changed to an unintended high level.

Therefore, JP-A-2002-84589 discloses a related art in which an upper limit of a volume setting value is set, and JP-A-2002-335137 discloses a related art in which sound volume is caused to be slowly changed.

When an upper limit of a volume setting value is set, however, a situation where the sound volume cannot be adjusted to a level which is desired by the user is caused. In a laboratory or the like, for example, there arises no problem even when a sound is reproduced at a high volume level. However, when an upper limit of the volume setting value is set, it is impossible to adjust the sound volume to a high volume level which is actually desired by the user.

When the sound volume is slowly changed, the actual change of the volume setting value cannot follow a user's operation of sound volume adjustment, thereby causing a sense of strangeness.

SUMMARY

It is therefore an object of the invention to provide a sound volume adjusting apparatus which can realize a sound volume change that follows a user's operation of sound volume adjustment while preventing a change to an unintended high sound volume level from occurring.

In order to achieve the object, according to the invention, there is provided a sound volume adjuster comprising: a storage which stores a first value of a volume setting value and an allowable maximum change amount; a receiver which receives a change request indicating a second value of the volume setting value; a determiner which, when a change amount of the volume setting value between the first value and the second value exceeds the allowable maximum change amount, determines that the change request is an excessive request; and an adjuster which, when the determiner determines that the change request is the excessive request: changes the first value stored in the storage by a change amount which is equal to or smaller than the allowable maximum change amount to set a third value of the volume setting value; and adjusts a sound volume by the third value.

The allowable maximum change amount may include a change value of the volume setting value for a time period from a first time to a second time, the storage may store the first value for the time period, the receiver may receive the change request indicating the second value at the second time, and the determiner may perform a first determining process in which the determiner determines whether the change request is the excessive request or not, based on whether a difference for the time period between the first value at the first time and the second value indicated by the change request received by the receiver at the second time exceeds the change value or not.

The allowable maximum change amount may include a difference value. When the receiver receives the change request, the determiner may perform a second determining process in which the determiner determines whether the change request is the excessive request or not, based on whether a difference between the first value and the second value exceeds the difference value or not, and after the determine performs the second determining process, the determiner may perform the first determining process until the time period elapses.

Only when the first value stored in the storage is equal to or larger than a fourth value, the determiner may determine whether the change request is the excessive request or not.

The receiver may receive the change request indicating the second value from an apparatus in which the second value is set. When the determiner determines that the change request is the excessive request, the determiner may transmit the third value stored in the storage to the apparatus.

When the apparatus receives the third value from the determiner, the third value may be set in the apparatus.

DETAILED DESCRIPTION OF EMBODIMENTS

Figure 1A:
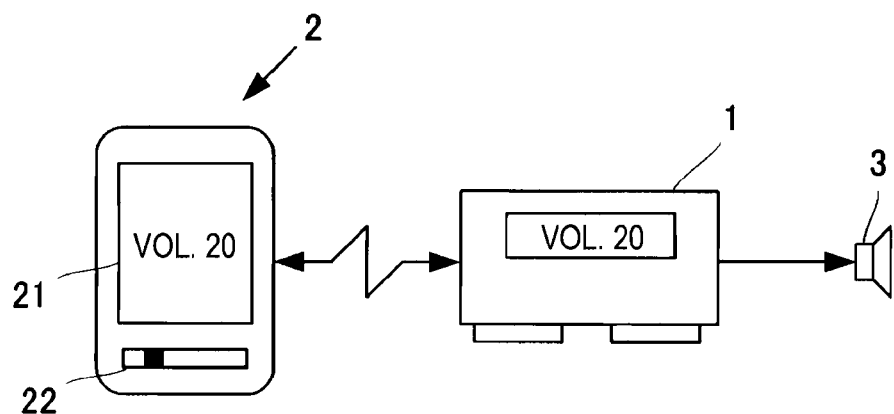
FIGS. 1A and 1B are block diagrams showing the configuration of an audio reproducing system.

FIG. 1A is a diagram showing the configuration of an audio reproducing system having an AV amplifier which is an embodiment of the sound volume adjusting apparatus of the invention.

The AV amplifier 1 is connected to a digital audio player (hereinafter, referred to as DAP) 2, and a speaker 3. In the appearance, the DAP 2 has a monitor 21 and a slider 22, and audio data are stored in a storage portion (not shown) which is incorporated therein. The DAP 2 has a function of transmitting and receiving various data to and from another apparatus. In the example of FIG. 1A, the DAP 2 reproduces audio data to produce an audio signal, and transmits the audio signal (alternatively, the audio data) to the AV amplifier 1 by wireless. Any system may be employed as the system for the wireless communication. Alternatively, the AV amplifier 1 and the DAP 2 may be connected to each other by a wire.

The slider 22 is an operating device which is used by the user for performing an operation of sound volume adjustment. The DAP 2 periodically (for example, every elapse of 100 ms) transmits a volume setting value (volume value), which is set in the DAP 2 by the slider 22, to the AV amplifier 1. In the example of FIG. 1A, the slider 22 is disposed in the DAP 2 as hardware. Alternatively, the slider may be realized as a touch panel which is displayed on the monitor 21 (realized as a software slider).

The AV amplifier 1 amplifies the audio signal received from the DAP 2, and then supplies the signal to the speaker 3. In the case where audio data are received, the audio data are decoded in the AV amplifier 1, and an audio signal is produced and then amplified. The amplifying amount is set in accordance with the volume value received from the DAP 2. In the case where the volume value is changed, when the change amount (the difference with respect to the immediately preceding volume value, or the degree of the sound volume change in a certain time width) exceeds an allowable maximum change amount, the AV amplifier 1 of the embodiment determines that an operation of sound volume adjustment which is not intended by the user is performed by, for example, an operational mistake or an error (or that an excessive request is issued), and changes the volume value by a change amount which is equal to or smaller than the allowable maximum change amount.

In the embodiment, the volume value is a value functioning as an index for the user, such as a numerical value showing a relative volume change indicated by a numerical value of from 0 (mute) to 100 (maximum output), and not a numerical value showing an actual sound pressure level (decibel as an absolute value). Alternatively, a numerical value showing an actual sound pressure level may be used as the volume value.

Figure 1B:
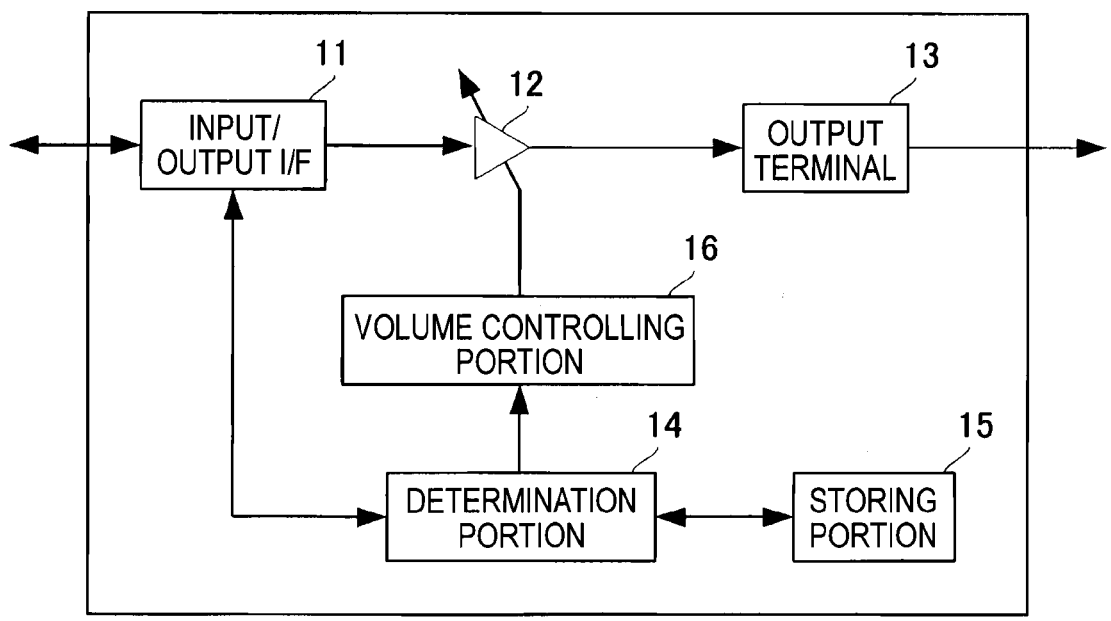

Hereinafter, the configuration and operation of the AV amplifier 1 will be described in detail. FIG. 1B is a block diagram showing the configuration of apart of the AV amplifier 1. Referring to FIG. 1B, the AV amplifier 1 includes an input/output interface (I/F) 11, an amplifier 12, an output terminal 13, a determining portion 14, a storing portion 15, and a volume controlling portion 16.

The input/output I/F 11 is a communication module which performs wireless communication with the DAP 2, and receives the audio signal (or audio data) and the volume value from the DAP 2. The received audio signal is supplied to the amplifier 12, and the volume value is supplied to the determining portion 14.

The amplifier 12 amplifies the audio signal at an amplification factor which is set by the volume controlling portion 16, and supplies the amplified signal to the output terminal 13. The output terminal 13 supplies the audio signal to the speaker 3, and the speaker 3 emits the sound. Although omitted in the figure, a D/A converter is disposed in front of the output terminal 13. In the case where audio data are received from the DAP 2, a decoder is disposed in front of the amplifier 12.

The determining portion 14 compares the input volume value with the volume value stored in the storing portion 15, and determines whether the input volume value is an excessive request or not. If it is determined that the value is an excessive request, the determining portion supplies a corrected volume value to the volume controlling portion 16. The volume controlling portion 16 sets an amplification factor corresponding to the input volume value into the amplifier 12. When the volume value is minimum (0), for example, the amplification factor is set to the minimum (mute), and, when the volume value is maximum (100), the amplification factor is set to the maximum output.

Next, the technique of determining whether the input volume value is an excessive request or not will be described with reference to FIGS. 2A to 2C.

Figure 2A:
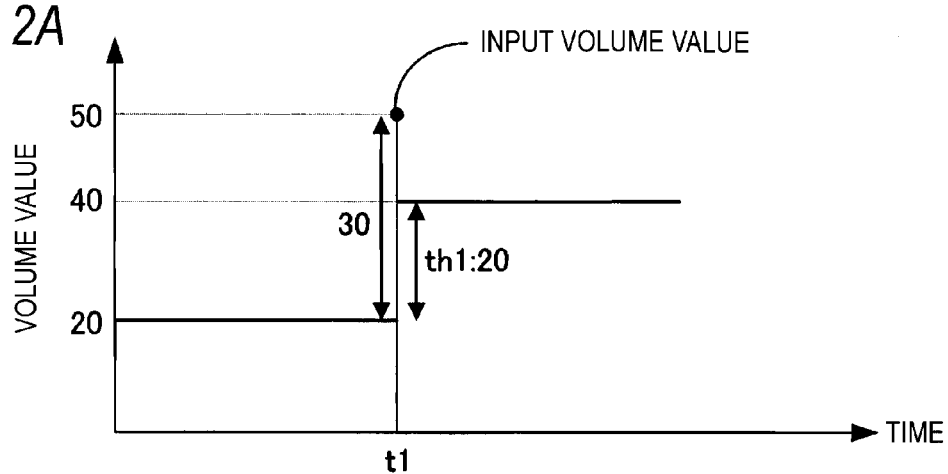
FIGS. 2A to 2C are views schematically showing an allowable maximum change amount.

FIG. 2A is a view showing an example in which the volume value is supplied from the DAP 2 at certain timing t1. In the embodiment, the volume value is periodically supplied from the DAP 2 every elapse of 100 ms. However, the time interval is not fixed, and has a width of a certain degree such as 80 ms to 120 ms depending on the processing load of the DAP 2. Alternatively, the DAP 2 may be configured so as to, only when the user performs the operation of sound volume adjustment, output the volume value.

In the example of FIG. 2A, in the time period before timing t1, the volume value in the AV amplifier 1 is set to 20, and the storing portion 15 stores the volume value of 20.

At timing t1, first, a volume value of 50 is input from the DAP 2, and the determining portion 14 reads the volume value of 20 from the storing portion 15, and calculates the difference between with respect to the input volume value of 50. In this case, the difference is 30. Then, the determining portion 14 compares the calculated difference with a threshold th1 which is the allowable maximum change amount stored in the storing portion 15. In the example of FIG. 2A, the threshold th1 is 20. In this case, the difference of 30 exceeds the threshold th1=20, and hence the determining portion 14 determines that the volume value is an excessive request.

If it is determined that the input volume value is an excessive request, the determining portion 14 corrects the input volume value so that the volume value is changed by a change amount which is equal to or smaller than the threshold th1, and supplies the corrected volume value to the volume controlling portion 16. In the example of FIG. 2A, the volume value is corrected by a change amount of the value which is equal to the threshold th1=20. Namely, the volume value of 20 is corrected to the volume value of 40, and the volume value of 40 is supplied to the volume controlling portion 16. The change amount is requested to be equal to or smaller than the threshold, and, in the minimum case, may be 0, or i.e., the immediately preceding volume value may be maintained as it is.

As described above, the example of FIG. 2A is configured so that, when a new volume value is input from the DAP 2, the difference between the volume value and the immediately preceding volume value is obtained, it is determined whether the difference exceeds the threshold or not, and, if the difference exceeds the threshold, the volume value is changed by a change amount of the value which is equal to or smaller than the threshold. According to the configuration, a change to a high sound volume level which is not intended by the user can be prevented from occurring. When the user adjusts the sound volume by a change amount which is equal to or smaller than the threshold, a change to the volume value which is equal to the one that is set by the user is performed. Therefore, the sound volume can be changed to the level which is intended by the user.

Figure 2B:
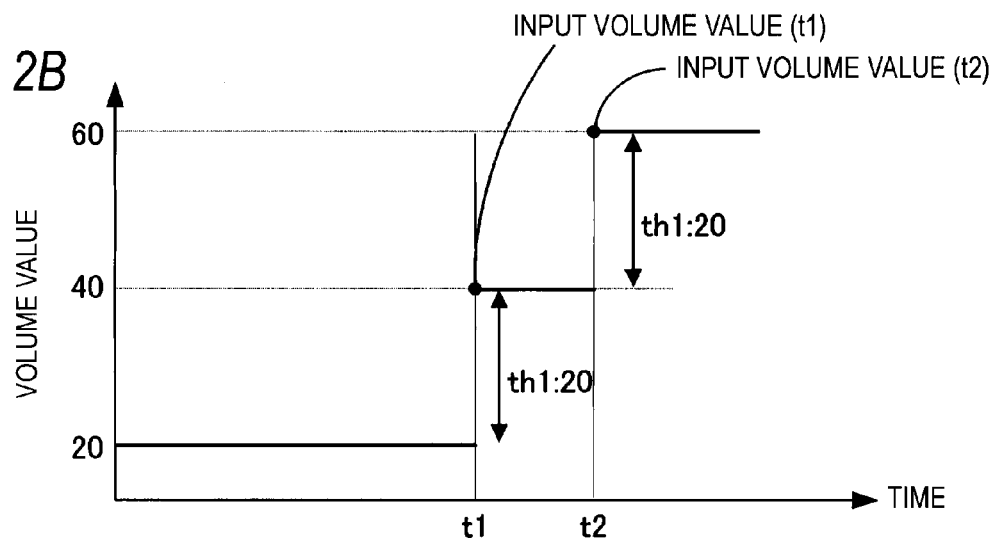

In the case where an operation of sound volume adjustment which is equal to or smaller than the threshold is repeatedly performed for a very short time period, such as the case where, as shown in FIG. 2B, the volume value of 20 is changed to the volume value of 40 at timing t1, and, after an elapse of 100 ms therefrom, the volume value of 40 is changed to the volume value of 60, there is also a possibility that the sound volume is changed to an unintended high level. Therefore, the determination whether the volume value is an excessive request or not may be performed in the following manner.

Figure 2C:
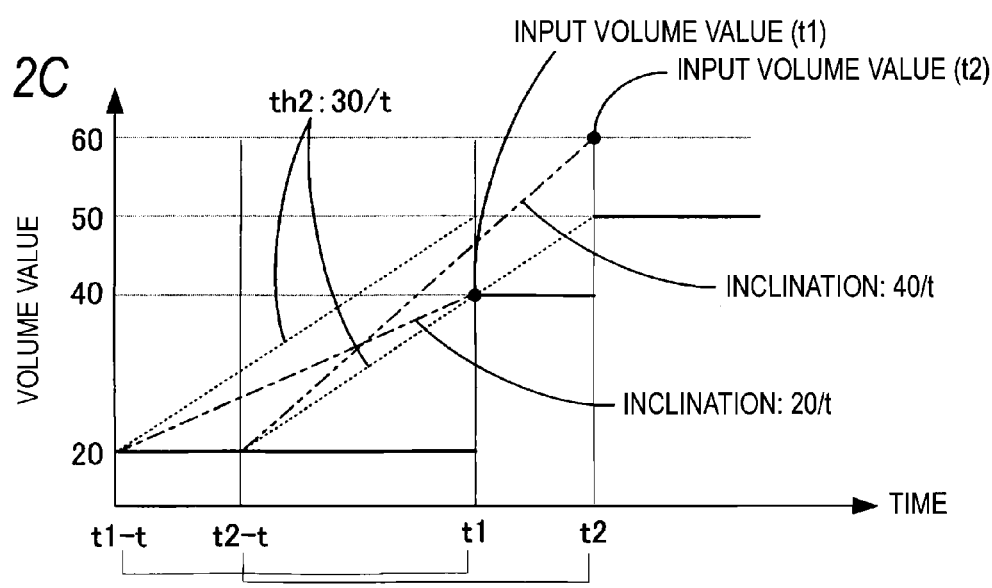

FIG. 2C is a view showing another determining technique. FIG. 2C shows an example in which, similarly with FIG. 2B, the volume value of 40 is input at timing t1, and the volume value of 60 is input at timing t2. In the determining technique, the allowable maximum change amount is defined by the inclination which is a change amount of the volume value per predetermined time period.

First, the volume value of 40 is input from the DAP 2 at timing t1, and then the determining portion 14 calculates the change amount (inclination) of the volume value per predetermined time period t. For example, the predetermined time period t is t=300 ms. Namely, the storing portion 15 stores the volume value at the timing preceding by 300 ms (the timing of (t1−t)). From the volume value of 20 for the past 300 ms and the input volume value of 40, the inclination 20/t=(40−20)/(t1−(t1−t)) is calculated. The inclination is compared with the threshold th2=30/t which is the allowable maximum change amount stored in the storing portion 15. In this case, the change amount of the input volume value is 20/t<30/t, or i.e., equal to or smaller than the allowable maximum change amount, and hence it is determined that the volume value is not an excessive request. Therefore, the input volume value is supplied as it is to the volume controlling portion 16.

At timing t2, next, the volume value of 60 is supplied from the DAP 2, and then the determining portion 14 calculates the inclination and compares it with the threshold th2 in a similar manner as described above. Namely, the determining portion reads the volume value of 20 at timing (t2−t) preceding by 300 ms, from the storing portion 15, and calculates the inclination 40/t=(60−20)/(t2−(t2−t)). In this case, the change amount of the volume value is 40/t>30/t, or i.e., exceeds the allowable maximum change amount, and hence the determining portion 14 determines that the volume value is an excessive request. Then, the determining portion 14 corrects the volume value so that the volume value is changed by the inclination of 30/t which is the threshold th2. Namely, the volume value is corrected to the volume value of 50 so as to be changed from the volume value of 20 preceding by 300 ms at the inclination of 30/t, and the volume value of 50 is supplied to the volume controlling portion 16. Also in this determining technique, the change amount is requested to be equal to or smaller than the threshold, and, in the minimum case, may be 0, or i.e., the immediately preceding volume value may be maintained as it is.

As described above, according to the determining technique of FIG. 2C, even when an operation of sound volume adjustment which is equal to or smaller than the threshold th2 is repeatedly performed for a very short time period, the change amount can be suppressed, or the current sound volume can be maintained, whereby a change to an unintended high sound volume level can be prevented from occurring. Also in the case of FIG. 2C, when the user adjusts the sound volume by a change amount of an inclination which is equal to or smaller than the threshold, a change to the volume value which is equal to the one that is set by the user is performed. Therefore, the sound volume can be changed to the level which is intended by the user.

In the example described above, the predetermined time period is set to 300 ms. The predetermined time period is not restricted to this value, and may be set to another value such as 500 ms. The predetermined time is set while assuming that the time period is required by the user for performing one operation. Actually, the predetermined time period may be adequately set in consideration of the user's sense of operation. Namely, the predetermined time period is set to a time period which allows an operation that is performed after elapse of the time period, to be determined as another operation (an operation intended by the user).

It is not required to fix the predetermined time period during operation. In the case where the predetermined time period is made variable with reference to the number of times when the volume value is input, for example, the predetermined time is set with reference to three inputs. Namely, when the volume value is supplied from the DAP 2 every elapse of 80 ms, 80 ms×3=240 ms is set as the predetermined time period, and values for the past 240 ms are stored. When the volume value is supplied from the DAP 2 every elapse of 120 ms, 120 ms×3=360 ms is set.

Figure 3:
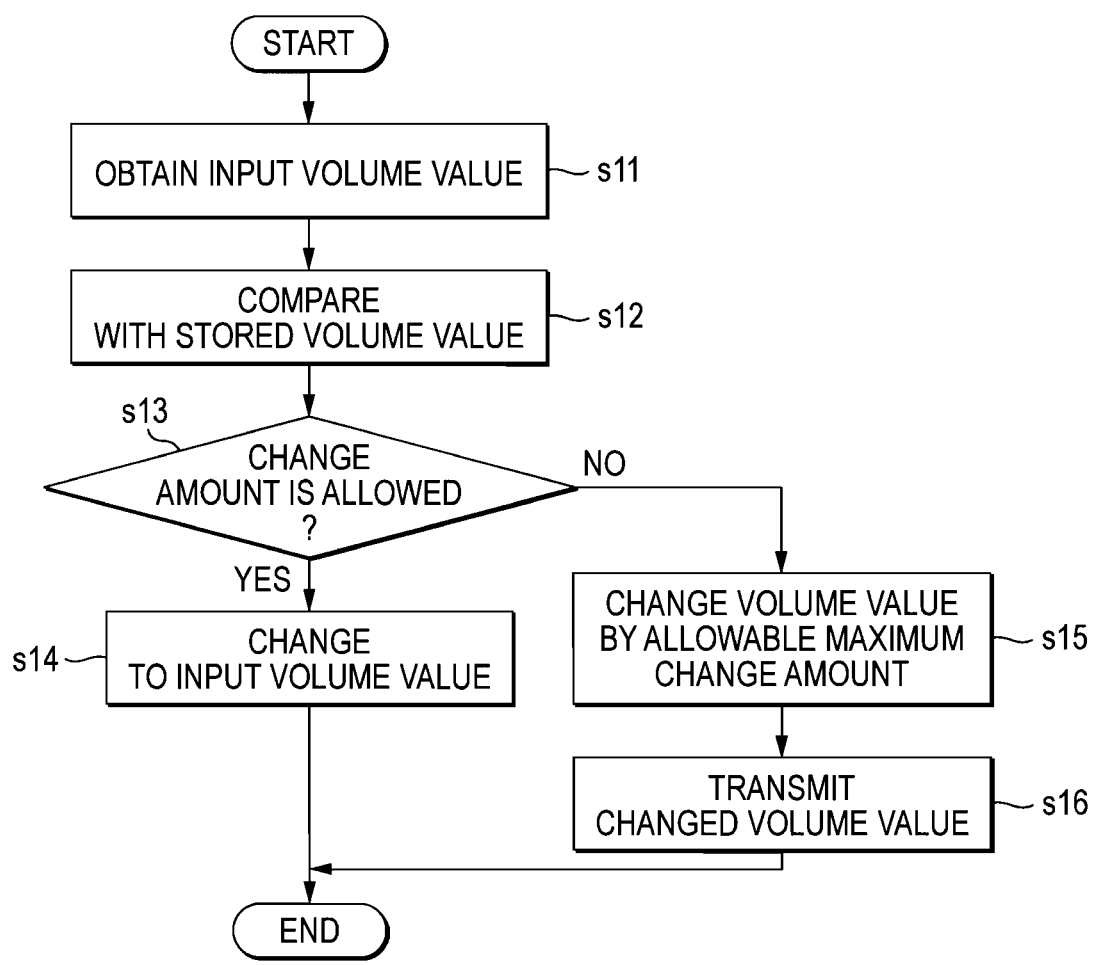
FIG. 3 is a flowchart showing the operation of an AV amplifier.

Next, the operation of the thus configured AV amplifier 1 will be described with reference to a flowchart. When the volume value is supplied from the DAP 2, the AV amplifier 1 performs the operation shown in the flowchart of FIG. 3. First, the determining portion 14 of the AV amplifier 1 obtains the volume value from the input/output I/F 11 (s11), and compares the volume value with that stored in the storing portion 15 to obtain a change amount (s12). The change amount may be either of the difference shown in FIG. 2A or the inclination shown in FIG. 2C. Then, the determining portion 14 determines whether the change amount is equal to or smaller than the allowable maximum change amount or not (s13). Namely, the determining portion 14 determines whether the difference is equal to or smaller than the threshold th1 or not, or whether the inclination is equal to or smaller than the threshold th2 or not.

Alternatively, in the case where the volume value is initially changed, it may be first determined by the determining technique of FIG. 2A whether the change amount is equal to or smaller than the allowable maximum change amount or not, and, until the predetermined time period (for example, 300 ms) elapses, it may be then determined by the determining technique of FIG. 2C whether the change amount is equal to or smaller than the allowable maximum change amount or not. In the case where the volume value is again changed after elapse of 300 ms, it is deemed that the volume value is initially changed, the determination is performed by the determining technique of FIG. 2A, and, until further elapse of 300 ms, the determination is performed by the determining technique of FIG. 2C. In consideration of a situation where a plurality of operations for a very short time period may be possibly caused by an operational mistake or an error, namely, a configuration where an initial operation after elapse of the predetermined time period is deemed as another operation is employed.

If it is determined that the change amount is equal to or smaller than the allowable maximum change amount, the determining portion 14 supplies the input volume value to the volume controlling portion 16 to change the volume value (s14). The determining portion 14 changes also the volume value which is stored in the storing portion 15 at this time.

By contrast, if it is determined that the change amount exceeds the allowable maximum change amount, the determining portion 14 corrects the input volume value by a change amount which is equal to or smaller than the allowable maximum change amount, and supplies the corrected volume value to the volume controlling portion 16 (s15). In a similar manner as described above, the determining portion 14 changes also the volume value which is stored in the storing portion 15 at this time.

Figure 4A:
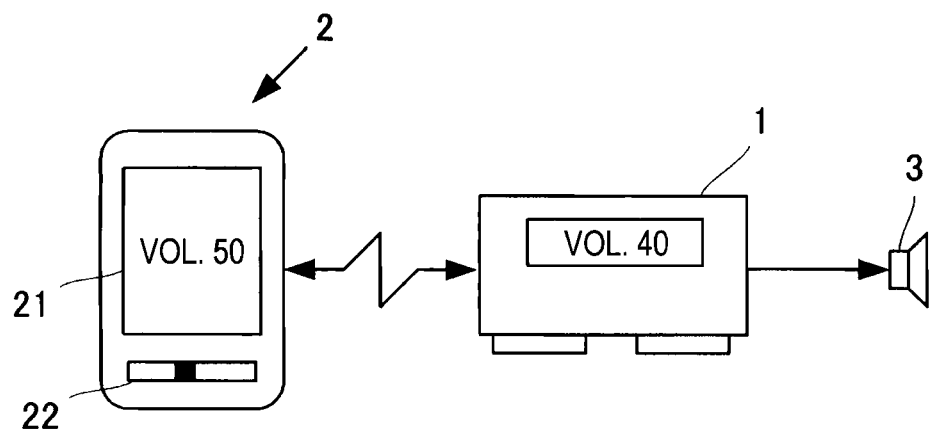
FIGS. 4A and 4B are diagrams showing an example in which, when a volume value is corrected, the volume value is returned to a DAP.
Figure 4B:
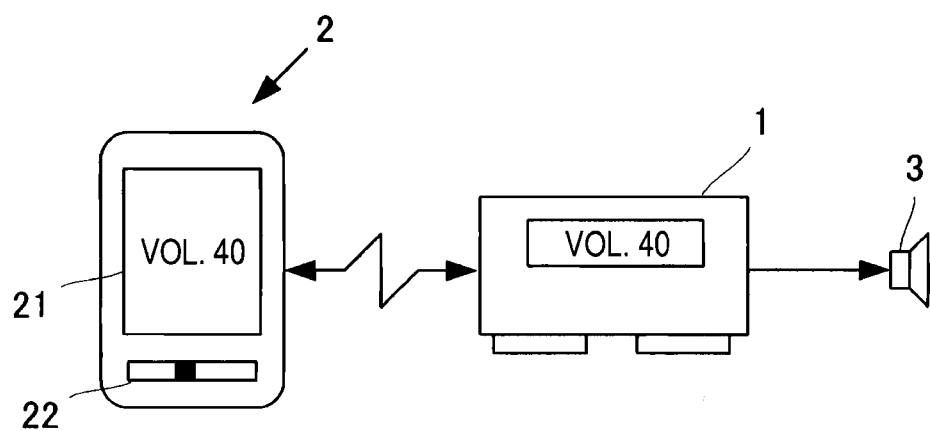

Then, the determining portion 14 transmits the corrected volume value to the DAP 2 (s16). As shown in FIG. 4A, for example, in the case where the volume value of 50 is supplied from the DAP 2 and the volume value is corrected to the volume value of 40, although the volume value is changed to 50 in the DAP 2, the volume value in the AV amplifier 1 is 40, and hence the volume value in the DAP 2 is not matched with that of the AV amplifier 1. In the process of s16 above, therefore, the determining portion 14 returns the corrected volume value to the DAP 2, whereby the volume value in the DAP 2 is forcibly returned to the volume value in the AV amplifier 1 so that the matching is maintained.

As described above, in the AV amplifier 1 of the embodiment, when the sound volume is to be changed by an amount which is equal to or larger than a certain change amount, the change amount is suppressed, or the current sound volume is maintained, whereby a change to an unintended high sound volume level can be prevented from occurring. In the case where the user adjusts the sound volume by an amount which is equal to or smaller than the allowable maximum change amount, the sound volume is changed to the volume setting value which is equal to the value that is set by user, and hence the sound volume can be changed to the level which is intended by the user. The sound volume is not slowly changed, and hence the actual change of the volume can follow the user's operation of sound volume adjustment.

A configuration may be employed where the determination whether the volume value is an excessive request or not is not performed on all volume values, but only on a volume value (high volume value) which is stored in the storing portion 15, and which is equal to or larger than a predetermined value. Namely, a limitation is not particularly set for a low volume value (for example, the volume value of small than 50), and the determination of an excessive request is performed only on a volume value (a volume value of 50 or more), and, even when an abrupt changing operation to a low volume value is performed for a short time period, the volume value is changed as requested. Namely, in the case where an absolute sound volume is small, even when a sound volume change is abruptly performed, the sound volume is not changed to a high level. Therefore, the configuration where, in such a case, a limitation is not particularly set is employed.

The allowable maximum change amount may be changed for a high sound volume level. For example, a limitation is not set for a volume value of 0 to 50, the threshold th1=20 is set for a volume value of 50 to 70, and the threshold th1=10 is set for a volume value of 70 or more.

The embodiment is configured so that the volume setting change request is received by receiving the volume setting value from the DAP 2. Alternatively, another configuration may be employed where an operating device (a slider or a rotary knob) for performing an operation of adjusting the sound volume is disposed in the AV amplifier 1 itself, and the volume setting change request is received from the operating device.

Although, in the embodiment, the apparatus which incorporates the sound volume adjusting apparatus of the invention is an AV amplifier, such an apparatus is not limited to an AV amplifier, and may be any apparatus in which the sound volume adjustment is performed.

According to an aspect of the invention, when an operation of sound volume adjustment which exceeds the allowable maximum change amount (for example, the difference with respect to the immediately preceding volume setting value, or a change amount of the volume setting value per predetermined time period) is performed, the sound volume is changed by a change amount which is equal to or smaller than the allowable maximum change amount. The change amount is the allowable maximum change amount at the maximum, and zero at the minimum. When the sound volume is to be changed by an amount which is equal to or larger than a certain change amount, therefore, the change amount is suppressed, or the current sound volume is maintained, whereby a change to an unintended high sound volume level can be prevented from occurring. In the case where the user adjusts the sound volume by an amount which is equal to or smaller than the allowable maximum change amount, the sound volume is changed to the volume setting value which is identical with the value that is set by user, and hence the sound volume can be changed to the level which is intended by the user. The sound volume is not slowly changed, and hence the actual change of the volume can follow the user's operation of sound volume adjustment.

The allowable maximum change amount may be set as a change amount (inclination) of the volume setting value per predetermined time period. In the case where the upper limit is determined in accordance with the difference with respect to the immediately preceding sound volume, when a request for a change which is equal to or smaller than the allowable maximum change amount is made at plural times for a short time period, there arises also a possibility that the sound volume is changed to an unintended high level. By contrast, in the case where the upper limit is determined in accordance with the inclination, a configuration is formed where the determination is made depending on the degree of the sound volume change in a certain time width. In this case, therefore, a change to an unintended high sound volume level can be prevented more accurately from occurring.

The determining portion may be configured so that, when the operation of sound volume adjustment is initially performed, it is determined whether the request is an excessive request, based on the difference with respect to the immediately preceding volume setting value, and thereafter the determination based on the inclination is performed until the predetermined time period elapses. After the predetermined time period elapses, an operation is again deemed as the initial operation of sound volume adjustment, and the process starting from the determination based on the difference with respect to the immediately preceding volume setting value may be repeated.

The determining portion may be configured so that, only when the volume setting value stored in the storage portion is equal to or larger than a predetermined volume setting value, it is determined whether the request is an excessive request. In the case where an absolute sound volume is small, even when a sound volume change is abruptly performed, the sound volume is not changed to a high level. Therefore, the configuration where, in such a case, a limitation is not particularly set is employed.

In the case where the volume setting change request is received from another connected apparatus, the volume setting value may be returned to the other apparatus, so that the volume setting value in the present apparatus is matched with that in the other apparatus. For example, this case corresponds to a case where the present apparatus is an AV amplifier, the other apparatus is a digital audio player, and an operation of sound volume adjustment is performed while setting the digital audio player as an operating device. In a configuration where a change of the sound volume is simply changed, even when the volume setting value in the other apparatus is changed, that in the present apparatus is not changed, and hence the set values in the present and other apparatuses are not matched with each other. By contrast, since the configuration where also the set value in the other apparatus is forcibly returned to the volume setting value in the AV amplifier is employed, the matching can be maintained.

According to an aspect of the invention, it is possible to a sound volume change that follows a user's operation of sound volume adjustment while preventing a change to an unintended high sound volume level from occurring.

What is claimed is:

1. A sound volume adjuster comprising:
    a storage which stores a first value of a volume setting value and an allowable maximum change amount;
    a communication interface operatively configured to receive a change request indicating a second value of the volume setting value;
    a comparison device operatively configured to, when a change amount of the volume setting value between the first value and the second value exceeds the allowable maximum change amount, determine that the change request is an excessive request; and
    a volume controller operatively configured to, when the comparison device determines that the change request is the excessive request:
        change the first value stored in the storage by a change amount which is equal to or smaller than the allowable maximum change amount to set a third value of the volume setting value; and
        adjust a sound volume by the third value, wherein the allowable maximum change amount includes a change value of the volume setting value for a time period from a first time to a second time, the storage stores the first value for the time period, the communication interface receives the change request indicating the second value at the second time, and the comparison device performs a first determining process in which the comparison device determines whether the change request is the excessive request or not, based on whether a difference for the time period between the first value at the first time and the second value indicated by the change request received by the communication interface at the second time exceeds the change value or not.

2. The sound volume adjuster according to claim 1, wherein the allowable maximum change amount includes a difference value, when the communication interface receives the change request, the comparison device performs a second determining process in which the comparison device determines whether the change request is the excessive request or not, based on whether a difference between the first value and the second value exceeds the difference value or not, and after the comparison device performs the second determining process, the comparison device performs the first determining process until the time period elapses.

3. The sound volume adjuster according to claim 1, wherein only when the first value stored in the storage is equal to or larger than a fourth value, the comparison device determines whether the change request is the excessive request or not.

4. A sound volume adjuster according to claim 1, wherein the communication interface receives the change request indicating the second value from an apparatus in which the second value is set, and when the comparison device determines that the change request is the excessive request, the comparison device transmits the third value stored in the storage to the apparatus.

5. The sound volume adjuster according to claim 4, wherein when the apparatus receives the third value from the comparison device, the third value is set in the apparatus.

* * * * *